Nov. 16, 1965 E. W. MADSEN 3,218,473

TRANSISTOR STATE SETTING CIRCUIT

Filed May 17, 1962

INVENTOR.
Elmer W Madsen
BY
Johnson and Kline
ATTORNEYS

United States Patent Office 3,218,473
Patented Nov. 16, 1965

3,218,473

TRANSISTOR STATE SETTING CIRCUIT

Elmer W. Madsen, Bristol, Conn., assignor to The Superior Electric Company, Bristol, Conn., a corporation of Connecticut Filed May 17, 1962, Ser. No. 195,626
3 Claims. (Cl. 307—88.5)

The present invention relates to an electric circuit that is incorporated into an electrical system having at least one transistor for setting the state, i.e., conduction or non-conduction, of the system transistor, upon energizing the system.

In many electrical systems, transistors are employed and upon the switching on of the system by the application of electric power thereto, it is undeterminable which state each transistor will assume. This is undesirable in many instances, one being a flip-flop type electric circuit wherein there are two transistors whose states are alternately conducting and non-conducting. Accordingly when the system is energized it is not known which transistor has assumed the conducting state or the non-conducting state. This has been found to present difficulties when, for example it is required that upon the energization of the system that certain transistors be in the conducting state and certain others be in the non-conducting state in order for the system to function as designed. Moreover, such a problem occurs not only with the initial energization of the system but also when the energization is interrupted and then resumed as with a short power failure.

It is accordingly an object of the present invention to provide an electric circuit which is coupled to an electric system having at least one transistor in which upon the energization of the system, the circuit will set the state, i.e. render conductive or non-conductive as is desired, the transistor of the system and will so function automatically at any time that energization is interrupted and then resumed of the system.

Another object of the present invention is to provide a circuit of the above type in which many system transistors may have their state set.

A further object of the present invention is to provide an electric circuit as above noted which is simple in construction, effective and reliable in use and always upon energization of the system sets the same state of conduction of the system transistors.

A feature of the present invention resides in the use in the system transistor setting state electric circuit of a circuit transistor that is rendered conducting in its collector-emitter circuit for all times when the voltage value of the energizing electric power is below a minimum selected value. The circuit and system are both energized from the same power source and when they are energized, the circuit transistor for a period as short as a few micro seconds is made conductive while the energizing voltage is increasing to its proper value. When the transistor is conducting, the emitter is, in effect, connected to ground or negative potential while the collector is connected to one of the elements, either base or collector of each of the system transistors through a one-way valve. By selecting the proper element of each system transistor to be connected to its one-way valve, the system transistor is made to assume either a conducting state or a non-conducting state. After the value of energizing voltage has increased beyond a low selected value, the electric circuit transistor is rendered non-conducting thereby in effect being electrically removed from the circuit and is so maintained while the energizing voltage is above the selected value. The system transistors by having a selected element of each placed at ground or a relatively negative potential have thus had their state of conduction or non-conduction set to that desired.

With the present circuit it will be appreciated that not only does the circuit set the system transistors to the wanted state whenever the system is energized but it also sets them each time at the same state and moreover the electric circuit also functions whenever a power failure occurs and then resumes.

Other features and advantages will hereinafter appear.

Figures 1, 2:
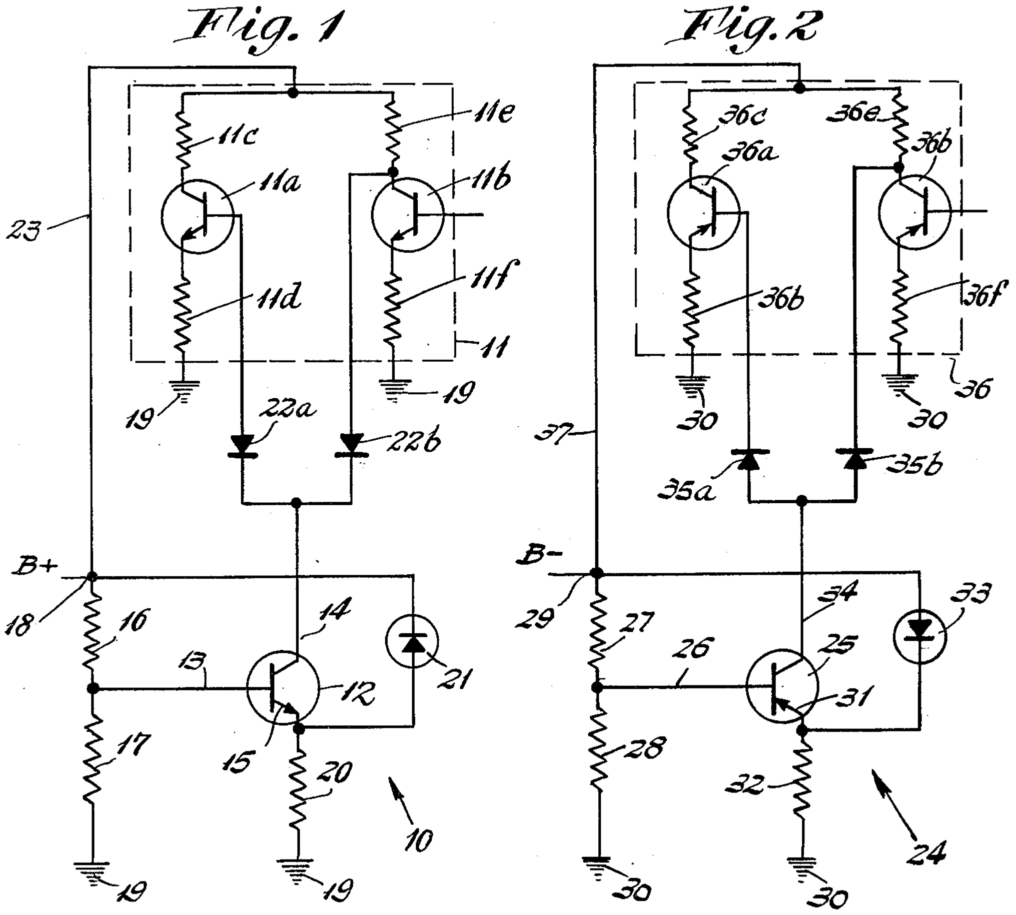
FIGURE 1 is a schematic diagram of one embodiment of the system transistor state setting circuit of the present invention for one type of transistor.
FIG. 2 is a schematic diagram of another embodiment of the system transistor state setting circuit of the present invention for the other type of transistor.

Referring to the drawing, FIG. 1, the electric circuit of the present invention is generally indicated by the reference numeral 10 and is employed to set the state of conduction or non-conduction of a plurality of system transistors and particularly transistors of the NPN type. Within the dotted line 11 indicating a system are two system transistors **11*a* and 11*b* and, as indicated on the drawing, transistors 11*a* and 11*b*** are NPN type transistors with the former having its state set to be non-conducting and the latter having its state set to be conducting. The former is connected to be base triggered and hence its base is its trigger point while the latter is connected to be collector triggered and hence its collector is its trigger point. Two system transistors have been disclosed in order to illustrate one of each of the two different states of conduction for each of this type of transistor though in many systems many transistors may have their state set by the circuit of the present invention.

The system transistor setting electric circuit 10 as herein disclosed specifically includes an NPN transistor 12 having a base 13, collector 14 and emitter 15. The base 13 is connected at the junction between a resistance 16 and a resistance 17. These two resistances are connected between an input terminal 18 of a B+ supply and a ground 19 and serve as a voltage divider to place on the base 13 a percentage of the voltage existing between the B+ supply terminal 18 and the ground 19. The emitter 15 is connected to the junction between a resistance 20 and a Zener diode 21 with the resistance 20 and diode 21 being connected in series between the B+ supply terminal 18 and the ground 19. One-way valves or diodes **22*a* and 22*b* are coupled between the collector 14 and one element of each of the system transistors, there being a diode connected to each transistor and both the diode and the system transistor have the same suffix letter. The diode 22*a* forwardly conducts from the base of the system transistor 11*a* to the collector 14 of the circuit transistor 12 while the diode 22*b* conducts from the collector of system transistor 11*b* to the collector 14 of the circuit transistor 12**.

In the operation of the present circuit, both the system transistors and the setting circuit 10 are connected to be energized by the same source 18, the former by lead 23 and to the ground 19. While the transistors **11*a* and 11*b* are shown schematically electrically connected with resistors 11*c*, 11*d*, 11*e* and 11*f*, these form no part of the present invention but merely illustrate a typical flip-flop circuit. When the system is not energized there is no voltage at the input terminal 18 but upon the energizing of the system and circuit by the application of electric power thereto the voltage at the terminal 18 will increase with respect to ground. This causes the voltage at the base 13 to be related to the input voltage at terminal 18 as the resistances 16 and 17 are a voltage dividing network and this base voltage will increase as the voltage at 18 increases. However, the Zener diode 21 will not conduct reversely until the voltage between the input terminal 18 and the ground 19 has reached its breakdown voltage and accordingly prevents any conduction therethrough for voltages thereacross less than its breakdown voltage. For the time that this condition exists, the emitter 15 will be negative with respect to the base 13 which causes the transistor 12 to be conductive in its collector-emitter circuit. This conduction through the diodes 22*a* and 22*b* and the resistor 20 in effect grounds or places at a negative potential each of the trigger points of the transistors 11*a* and 11*b* connected to their respective diodes. The placing of the base of system transistor 11*a* at substantially ground potential sets its state to that of non-conduction while placing the collector of system transistor 11*b* at substantially ground potential sets its state to that of conduction. While only two type NPN system transistors have been shown, many more may be set by connecting the proper trigger point of each additional system transistor through a diode to the collector 14**, the selection of the trigger point depending on the state to which the system transistor is to be set.

After the B+ terminal input voltage has increased beyond the breakdown voltage of the Zener diode 21, then the emitter 15 becomes positive with respect to the base 13 which ceases conduction in the collector-emitter circuit of the transistor 12 and thus prevents further grounding of the elements of the transistors **11*a* and 11*b*. The breakdown voltage of the Zener diode 21 is set to be well below the normal input terminal voltage in order that normal fluctuations thereof do not operate the circuit 10 and to electrically remove the circuit 10 from the system 11 as soon as possible consistent with assurance that the state of the system transistors will be set. The non-conduction of transistor 12 prevents the circuit 10 from interfering with the normal operation of the system 11**.

One set of values of particular elements of the circuit 10 that has been found satisfactory consists of resistance 16, 16.8K ohms; resistance 17, 470 ohms; resistance 20, 100 ohms; Zener diode 21, type 1M6.8Z having a breakdown voltage of 6.8 volts and transistor 12, type 2N1303. The diodes **22*a* and 22*b* may be type 1N191 while the system transistors 11*a* and 11*b* are type NPN and may be 2N585. The normal voltage at the input terminal 18** is plus 12 volts with respect to ground.

For setting the state of conduction of the type PNP transistor reference is made to the embodiment of the system transistor state setting circuit of the present invention shown in FIG. 2. This embodiment is similar to that shown in FIG. 1 only the transistors are of the other type having a different polarity characteristic and hence current conduction is required to be reversed from that shown in FIG. 1. Referring to FIG. 2, the transistor state setting circuit is generally indicated by the reference numeral 24 and includes a transistor 25 having a base 26 connected to a junction of a pair of resistances 27 and 28. The resistances 27 and 28 are connected between a B minus voltage source 29 and a positive ground 30. The emitter 31 of transistor 25 is connected through a resistance 32 to the positive ground 30 while a Zener diode 33 is connected to the emitter 31 and the B minus voltage source. The collector 34 of transistor 25 connects through diodes **35*a* and 35*b* to a system enclosed by dotted lines 36 having a flip-flop circuit that includes a transistor 36*a* and another transistor 36*b*. The B minus voltage source also is connected to the transistors 36*a* and 36*b* through a lead 37 as is the positive ground 30. The transistors 36*a* and 36*b* are connected in a flip-flop circuit of conventional construction and may include resistances 36*c*, 36*d*, 36*e* and 36*f***.

The circuit 24 functions in the same manner as the circuit 10 in setting the state of the transistors **36*a* and 36*b* with the transistor 36*a* being rendered non-conducting by the connection of its base to the diode 35*a* while the transistor 36*b* is rendered conducting by the connection of diode 35*b* to its collector. The transistors herein employed are the PNP type and may be type 2N1303. The resistances 27, 28 and 32 may have a value of 16.8K ohms, 470 ohms and 100 ohms while the Zener diode 33 may be type 1M6.8Z having a breakdown voltage of 6.8 volts. The diodes 35*a* and 35*b*** may be type 1N191.

It will be understood that in each embodiment of the invention the system transistors and the circuit transistors are all either NPN type or PNP type and thus the transistor of the circuit has the same polarity characteristic as the system transistors whose states are set by the circuit transistor. Thus in all embodiments, each system transistor has a set voltage which when applied to its trigger point sets its state and the set voltage is only applied when the source voltage is greater than a minimum needed to render transistor 12 or 25 conducting but less than the Zener diode (21 or 33) breakdown voltage, the latter being less than the normal voltage of the source 18.

It will accordingly be appreciated that there has been disclosed an electric circuit that is connected to an electrical system having a plurality of system transistors for setting the state of the system transistors to that of conduction or non-conduction upon the energization of the system and circuit. The state of each system transistor is always set the same by the electric circuit and moreover said circuit functions to set the state upon an interruption and resumption of electrical power to the system. The circuit is simple in construction yet reliable in use requiring only a few parts and yet it is capable of setting the state of many system transistors.

Variations and modifications may be made within the scope of the claims and portions of the improvements may be used without others.

I claim:

1. An electric circuit connected to an electric system having at least one system transistor having a trigger point which when actuated by a set voltage sets the state thereof, said circuit setting the state of said system transistor upon energization of the system by a voltage source connected to energize the electric system and circuit at a normal voltage, comprising a circuit transistor having a base, emitter and collector, means connecting the base to the voltage source to apply a potential thereto that is proportional to the voltage of the voltage source, voltage breakdown means being nonconductive below a constant voltage and being conductive above the constant voltage, said constant voltage having a value less than the normal voltage value, means connecting the voltage breakdown means to the voltage source and the emitter, at least one one-way valve, said valve being connected to the trigger point of the system transistor and the circuit transistor whereby when the voltage at the source is less than the constant voltage of the voltage breakdown means the circuit transistor is rendered conducting to place the trigger point of said system transistor at its set voltage to thereby set the state of the system transistor.

2. The invention as defined in claim 1 in which all the system transistors and the circuit transistor each have the same polarity characteristics.

3. An electric circuit connected to an electric system having a plurality of system transistors with each having a trigger point which when actuated by a set voltage sets the state thereof, said circuit setting the state of said system transistors upon energization of the system by a voltage source connected to energize the electric system and circuit by a normal voltage, comprising a circuit transistor having a base, emitter and collector, means connecting the base to the voltage source to apply a potential thereto that is proportional to the voltage of the voltage source, voltage breakdown means being nonconductive below a constant voltage and being conductive above the constant voltage, said constant voltage having a value less than the normal voltage value, means connecting the voltage breakdown means to the voltage source and the emitter, a plurality of one-way valves, means connecting a one-way valve to the trigger point of each system transistor and all valves in parallel to the collector, whereby when the voltage at the source is less than the constant voltage of the voltage breakdown means the circuit transistor is rendered conducting to place the trigger point of each system transistor at its set voltage to thereby set the state of each system transistor.

References Cited by the Examiner

UNITED STATES PATENTS

| | | | |
|---|---|---|---|
| 3,035,767 | 5/1962 | Orr | 328—48 |
| 3,044,065 | 7/1962 | Barney et al. | 328—48 |
| 3,069,557 | 12/1962 | Skelton | 307—88.5 |
| 3,097,314 | 7/1963 | Harriman | 307—88.5 |
| 3,104,353 | 9/1963 | Theobald | 307—88.5 |
| 3,109,979 | 11/1963 | Faulkner | 307—99.5 |
| 3,122,646 | 2/1964 | Deysher et al. | 307—99.5 |
| 3,152,306 | 10/1964 | Cooper et al. | 307—88.5 |
| 3,157,870 | 11/1964 | Marino et al. | 307—88.5 |

JOHN W. HUCKERT, *Primary Examiner.*